United States Patent
Gabioud et al.

(10) Patent No.: US 7,327,077 B2
(45) Date of Patent: Feb. 5, 2008

(54) ELECTRON TUBE CONTROL GRID

(75) Inventors: André Gabioud, Thonon les Bains (FR); Michel Langlois, Thonon les Bains (FR)

(73) Assignee: Thales, Neuilly sur Seine Cedex (FR)

( * ) Notice: Subject to any disclaimer, the term of this patent is extended or adjusted under 35 U.S.C. 154(b) by 185 days.

(21) Appl. No.: 10/815,718

(22) Filed: Apr. 2, 2004

(65) Prior Publication Data

US 2004/0263050 A1 Dec. 30, 2004

(30) Foreign Application Priority Data

Apr. 4, 2003 (FR) .................................. 03 04229

(51) Int. Cl.
*H01J 29/46* (2006.01)
*H01J 29/48* (2006.01)

(52) U.S. Cl. ...................... 313/447; 313/414

(58) Field of Classification Search ............... 313/349, 313/454, 348, 459, 346 DC, 442, 446–448, 313/452, 346 R, 293, 412, 414, 458; 315/14, 315/3.5, 5.37, 31 R
See application file for complete search history.

(56) References Cited

U.S. PATENT DOCUMENTS

| | | | | |
|---|---|---|---|---|
| 2,283,004 A * | 5/1942 | Gebauer et al. | ........ | 313/103 R |
| 2,617,959 A * | 11/1952 | Fay | ........................... | 313/293 |
| 4,345,182 A | 8/1982 | Adamski | | |
| 4,593,230 A * | 6/1986 | True | ........................... | 315/14 |
| 4,737,680 A * | 4/1988 | True et al. | .................. | 313/349 |
| 5,936,335 A * | 8/1999 | Clerc | .................... | 313/346 R |

FOREIGN PATENT DOCUMENTS

| | | |
|---|---|---|
| GB | 820 885 | 9/1959 |
| GB | 2 326 272 A | 12/1998 |
| JP | 3-30239 | 2/1991 |

OTHER PUBLICATIONS

English translation of Japanese Patent Publication 03-030239 to Hayashi Toshiyuki Kazutaka.*

* cited by examiner

*Primary Examiner*—Edward J. Glick
*Assistant Examiner*—Anastasia S. Midkiff
(74) *Attorney, Agent, or Firm*—Oblon, Spivak, McClelland, Maier & Neustadt, P.C.

(57) ABSTRACT

In a control grid for an electron tube, the grid has first bars that are evenly spaced out on a skewed surface and extend substantially as circle pseudo-involutes about a central hub.

8 Claims, 7 Drawing Sheets

Background Art

FIG.3

Background Art

ELECTRON TUBE CONTROL GRID

BACKGROUND OF THE INVENTION

1. Field of the Invention

The invention relates to an electron tube control grid. The field of the invention is that of electron tubes, especially grid-based electron tubes working with longitudinal electron beams such as, for example, inductive output tubes. Hereinafter in the description, this type of tube shall be referred to as an "IOT". It is understood that the invention is not limited to IOTs.

An IOT comprises an electron gun that emits an electron beam, a resonant cavity crossed by the beam and a collector that collects the electrons from the beam at their exit from the cavity.

Figure 1:
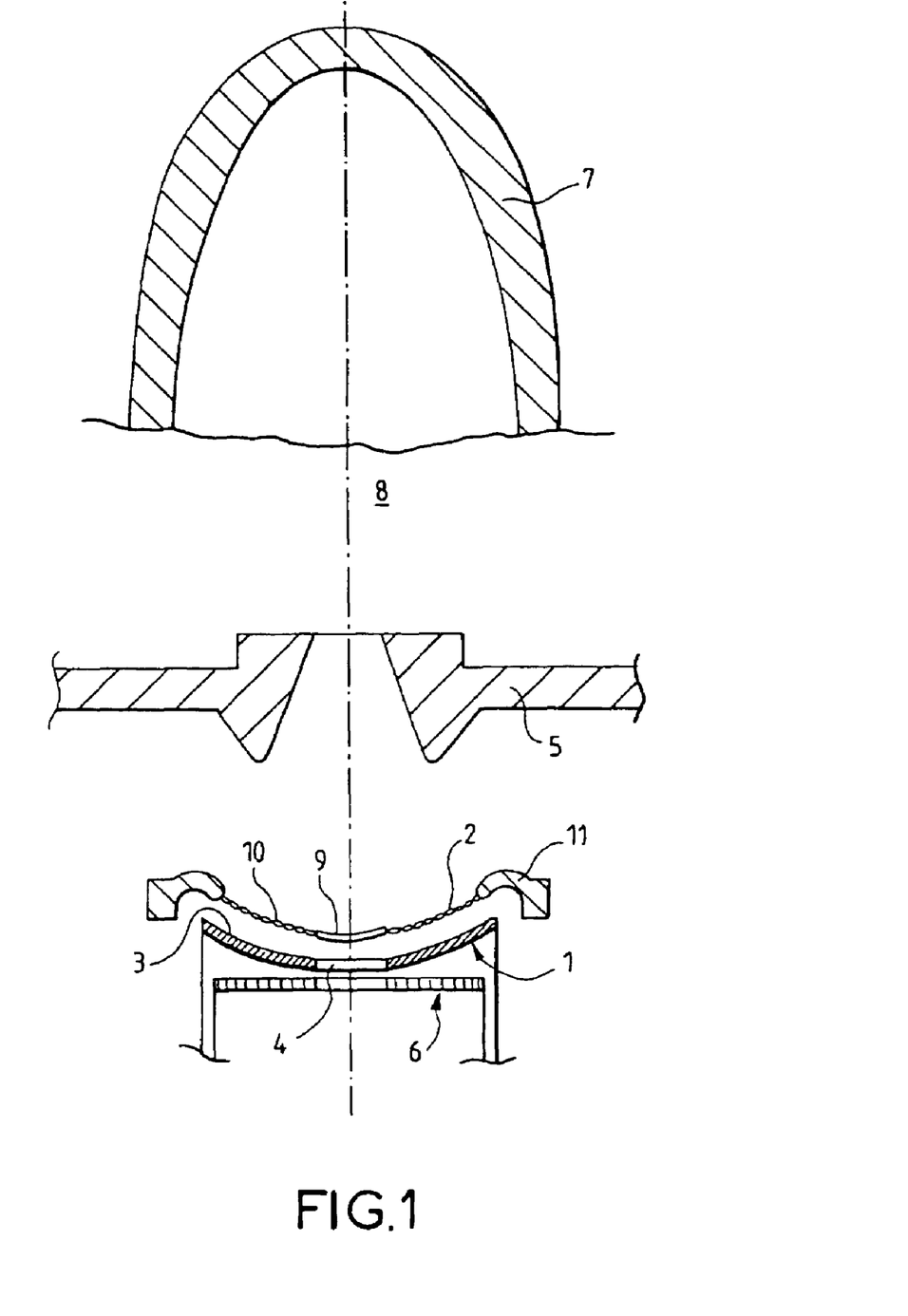
FIG. 1 is a longitudinal schematic sectional view of an exemplary electron tube.

For a clearer understanding of the invention, an IOT is shown in FIG. 1 which is a view in longitudinal section of an exemplary electron tube represented partially and comprising a cathode 1 and a control grid 2, both shaped for example as spherical segments. The cathode 1 and the control grid 2 form the electron gun. The cathode 1 has an emitting part 3 in the shape of a spherical segment that demarcates a substantially central hollow portion 4. An anode 5 and a heating device 6 of the cathode 1 are also shown in this figure. The electrons emitted by the cathode 1 are recovered at the end of travel in a collector 7. The concave face of the cathode 1 emits electrons when it is taken to high temperature by means of the heating device 6. The electrons go through the control grid 2 and penetrate a resonant cavity 8, forming a longitudinal beam before they reach the collector 7.

The control grid 2 is used to modulate the emission of electrons so as to obtain a variation in the density of the beam before it enters the resonant cavity 8. The control grid has a solid central hub 9 around which bars 10 have been developed. The electron beam passes between these bars. The bars are fixed firstly to the central hub 9 and secondly to the body of the electron tube by means of an outer collar 11 belonging to the grid 2.

2. Description of the Prior Art

Figure 2:
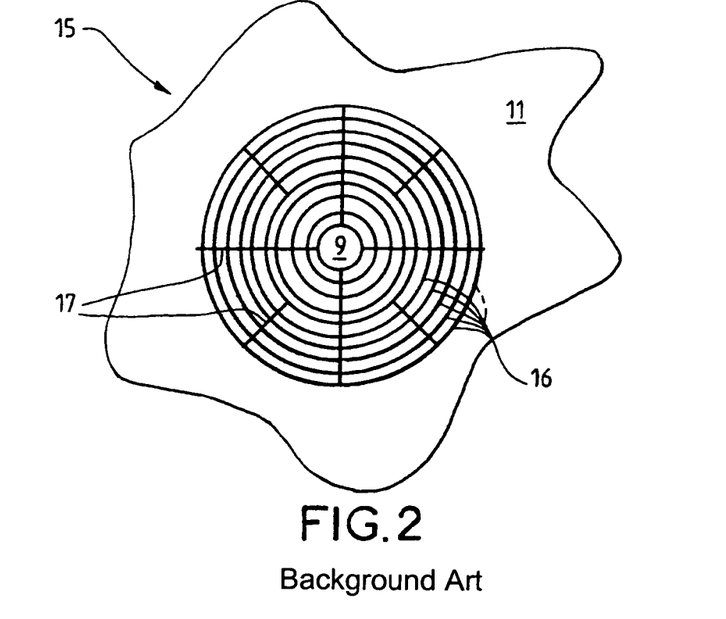
FIG. 2 gives a view, in a plane perpendicular to the axis of the electron beam, of a known plane control grid.

FIG. 2 gives a view, in a plane perpendicular to the axis of the electron beam, of a prior art plane control grid 15. This grid has several concentric circular bars 16 held together by means of radial bars 17. The bars 17 are fixed to the outer collar 11 and, in the case of some of them, to the central hub 9. The concentric circular bars 16 are arranged at a constant interval or spacing on the surface crossed by the electrons. On this constant nature of the interval depends the quality of the electron beam in terms of homogeneity, density of flow and speed of the particles. This constant nature also affects the transconductance of the electron tube. The transconductance is defined by $\Delta i/\Delta v$ where $\Delta i$ represents a variation of intensity at the anode 5 and $\Delta v$ represents a variation of voltage between the control grid 2 and the cathode 1.

Figure 3:
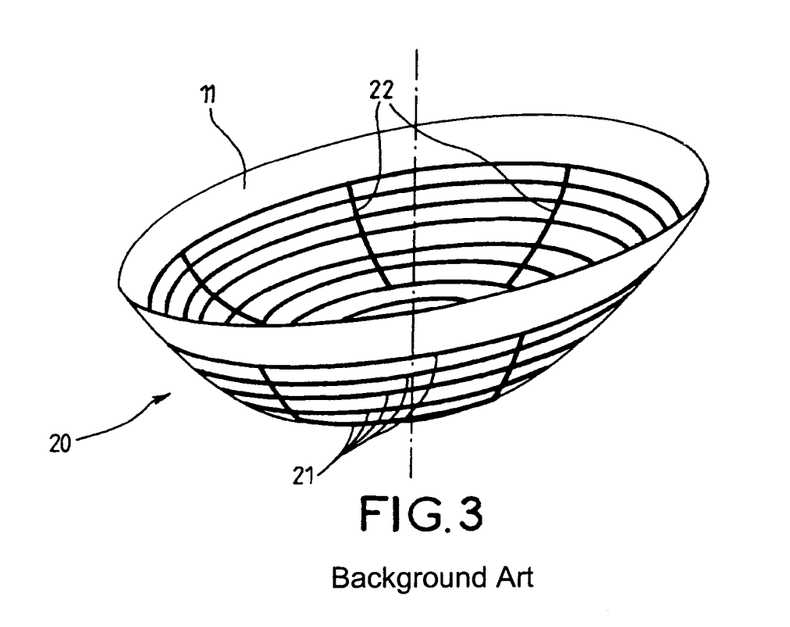
FIG. 3 is a view in volume of a prior art spherical control grid.

FIG. 3 is a view in volume of a prior art spherical control grid 20. The working of the control grid 20 is similar to that of the control grid 15 shown in FIG. 2. The control grid 20 has bars 21 laid out at a constant interval on the surface crossed by the electrons. The bars 21 represent parallels or lines of latitude of the spherical surface formed by the control grid 20. The control grid 20 also has bars 22 whose function is equivalent to that of the bars 17 shown in FIG. 2. The bars 22 are fixed to the outer collar 11 and some of them are fixed to the central hub 9. The bars 22 represent meridian or longitude lines of the spherical surface formed by the control grid 20. The term "meridian lines" and "parallels" are defined by analogy with the terrestrial sphere.

In these two prior art control grids 15 and 20, the bars 16 and 21 control the electron beam. More specifically, the flow rate of the electrons coming from the cathode is controlled by the potential of the control grid used. Depending on its potential, the grid pushes back the electrons to the cathode 1 or lets them pass through toward the anode 5. On the contrary, the radial bars 17 or meridian lines 22 have a rather disturbing effect on the control of the electron beam. They intercept a part of the electron beam. The utility of the bars 17 and 22 is limited essentially to the mechanical holding of the bars, 16 and 21 respectively, as well as to the conductive discharge of the heat generated in the control grid by the interception of a part of the electron beam and by the radiation of the cathode 1. The heat is discharged to a major extent toward the outer collar 11. It is important to note that the part of the heat generated in the control grid is due to the interception of a part of the electron beam by the bars 17 and 22.

The invention proposes a solution to this problem by limiting the presence of bars that make little contribution to the control of the electron beam. This is done without impairing the heat conduction of the control grid.

SUMMARY OF THE INVENTION

To this end, an object of the invention is a control grid of an electron tube, comprising first bars that are evenly spaced out, wherein the first bars extend substantially as circle involutes or circle pseudo-involutes about a central hub.

Such an arrangement augments the mechanical rigidity of the grid and lowers its mean temperature. Indeed, the first three bars carry out the three functions described here above, namely controlling the electron beam, mechanically holding the grid and providing for sufficient heat conduction. Thus, by increasing the number of first bars, the mechanical behavior and heat conduction of the grid is improved without disturbing the control of the electron beam.

BRIEF DESCRIPTION OF THE DRAWINGS

The invention will be understood more clearly and other advantages shall appear from the following detailed description of several alternative embodiments of grids according to the invention. The description is illustrated by the appended drawing in which.

MORE DETAILED DESCRIPTION

FIGS. 1, 2 and 3 have already been described further above to present the invention.

Figure 4:
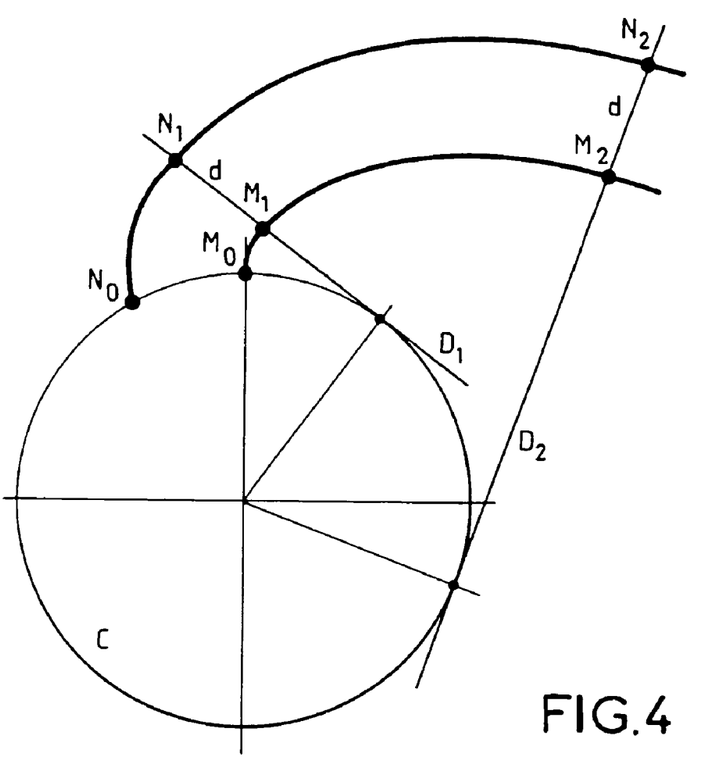
FIG. 4 provides an explanation of the definition of a curve that is a circle involute.

Referring to FIG. 4, we may recall the definition of the curve called a "circle involute". It is the geometrical locus of a point Mi of the straight line Di, that is tangential to a circle C and rolls without slipping on the circle C. Another point Ni of the straight line Di describes another involute of the same circle C located at a constant distance d from the first circle involute. In FIG. 4, the sub-reference i, which is a natural integer, used for the points M and N as well as for the straight line D, describes different positions of the straight line D as it rolls about the circle C. This convention is also used in FIG. 5.

Figure 5:
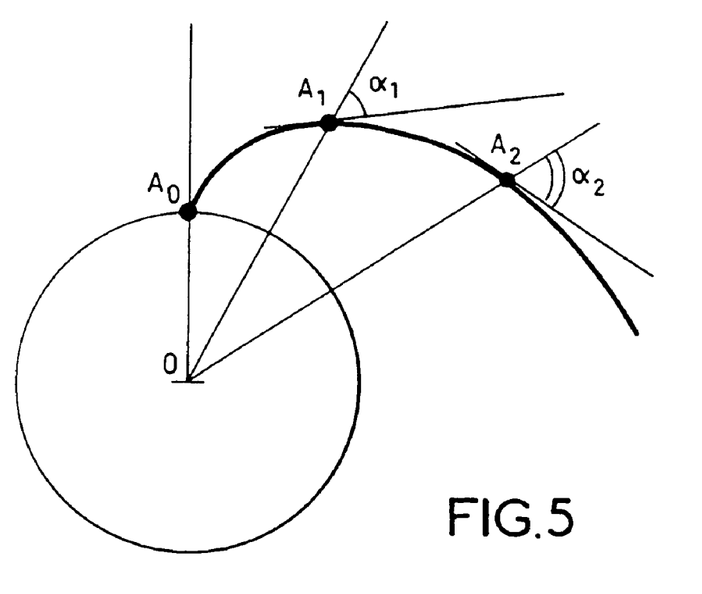
FIG. 5 shows another property of a curve that is a circle involute.

As shown in FIG. 5, it can be noted that, at the circle C, a curve that is a circle involute forms an angle zero with a radius $OA_0$ of the circle C, this radius passing through the point $A_0$ where the circle involute touches the circle C. The greater the distance between a point Ai, located on the circle involute and the circle C, the greater is the increase in the angle αI, formed by the circle involute and a straight line Oai at the point Ai, until this angle reaches 90° at infinity.

Figure 6:
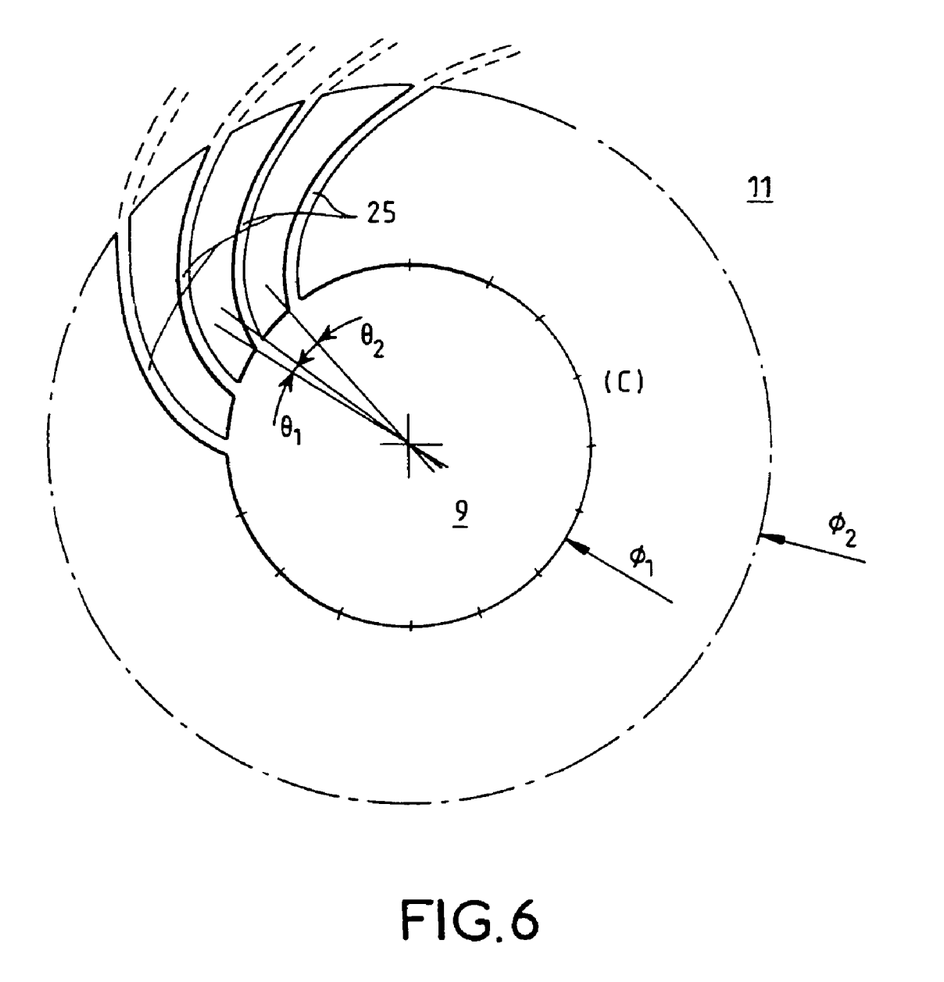
FIG. 6 shows the mesh of a plane grid according to the invention.

FIG. 6 further specifies the geometry of a plane grid according to the invention. The mesh, or distribution of the bars of the grid, is advantageously done on a ring between two concentric diameters φ1 and φ2. The diameter φ1 represents the outer diameter of central hub 9 about which there extend first bars 25 as circle involutes. The mesh is formed by a set of curves constituting involutes of the circle C with a diameter φ1. The curves are offset by an angle θ1 to form a first bar 25 and by an angle θ2 to generate the interval between two first neighboring bars 25. Each first bar 25 than has a constant thickness equal to $$\frac{\phi 1}{2}\theta 1.$$

The interval between two neighboring first bars is then equal to $$\frac{\phi 1}{2}\theta 2.$$

These two formulae θ1 and θ2 are expressed in radians. To fill the ring about the circle C, the number of first bars 25 is than equal to $$\frac{2\pi}{\theta 1 + \theta 2}.$$

The angles θ1 and θ2 are defined so that the number of first bars 25 is an integer. Thus the first bars 25 are evenly spaced out about the central hub 9.

The notion of a circle involute is defined only for plane curves. For the purposes of the invention, a definition is made for a skewed, i.e. non-plane, surface of a curve constituting a circle pseudo-involute by analogy with a circle involute. This definition is based on the following geometrical property: each point of a curve forming a circle pseudo-involute is equidistant from another curve forming a circle pseudo-involute relative to the same circle. Until today, there has been no definition of a curve on a skewed surface having this geometrical property.

Figure 7:
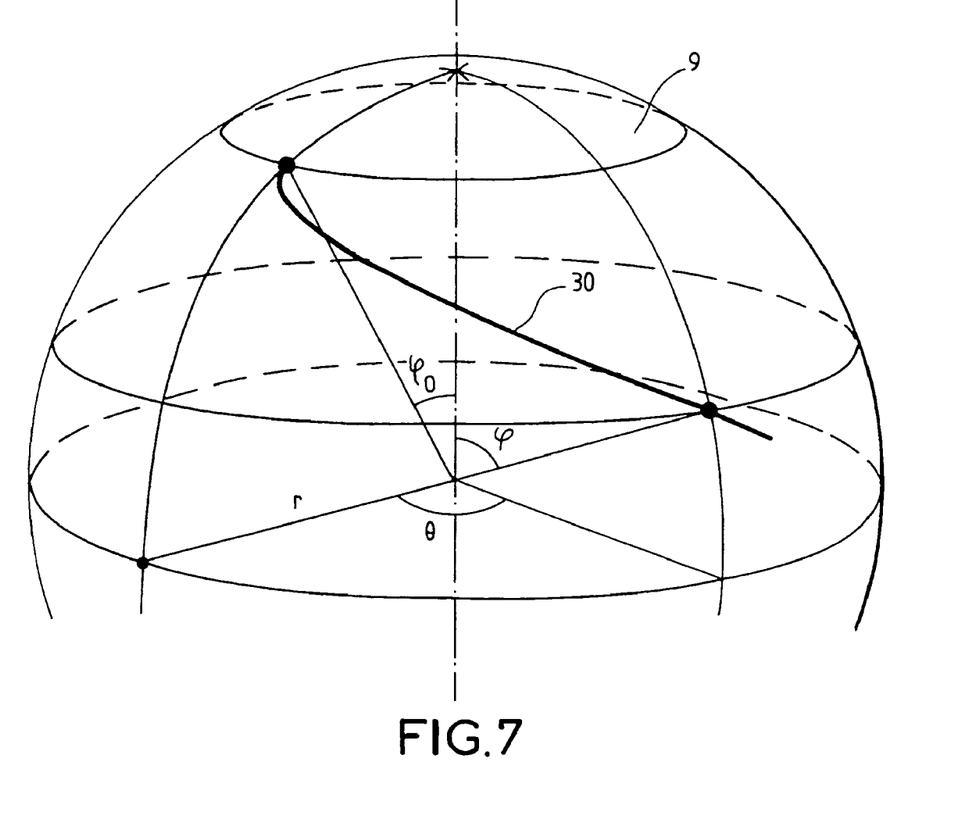
FIG. 7 exemplifies a curve that is a circle pseudo-involute made on a spherical sector.

By way of an example, FIG. 7 shows an exemplary curve 30 forming a circle pseudo-involute made on the surface of a sphere. It is indeed common practice to make a grid extending on a spherical sector contained, for example, between two parallel circles. The mesh is then formed by a set of curves forming circle pseudo-involutes about the hub demarcated by a parallel circle. The equation of such a curve can be defined in a system of spherical coordinates θ and φ where θ represents the angle that the meridian lines of the sphere form with each other and φ represents the angles that the parallels of the sphere form with each other:

$$\theta = \frac{1}{2}\arcsin\left[\frac{2-(u+1)\sin^2\varphi_0}{2\cos\varphi_0}\right] + \frac{1}{\sin\varphi_0}\arcsin\left[\frac{u-1}{(u+1)\cos\varphi_0}\right] -$$
$$\frac{1}{2}\arc\left[\frac{2u-(u+1)\sin^2\varphi_0}{2u\cos\varphi_0}\right] + \frac{\pi}{2}\left[1 - \frac{1}{\sin\varphi_0}\right]$$

where $u = tg^2\frac{\varphi}{2}$ and where $\varphi_0$ represents the angle of the parallel circle defining the central hub 9.

The meshing of a grid that complies with the invention and uses curves forming pseudo-involutes of a sector can be made by analogy with the meshing of a plane grid described by means of FIG. 6.

Figure 8:
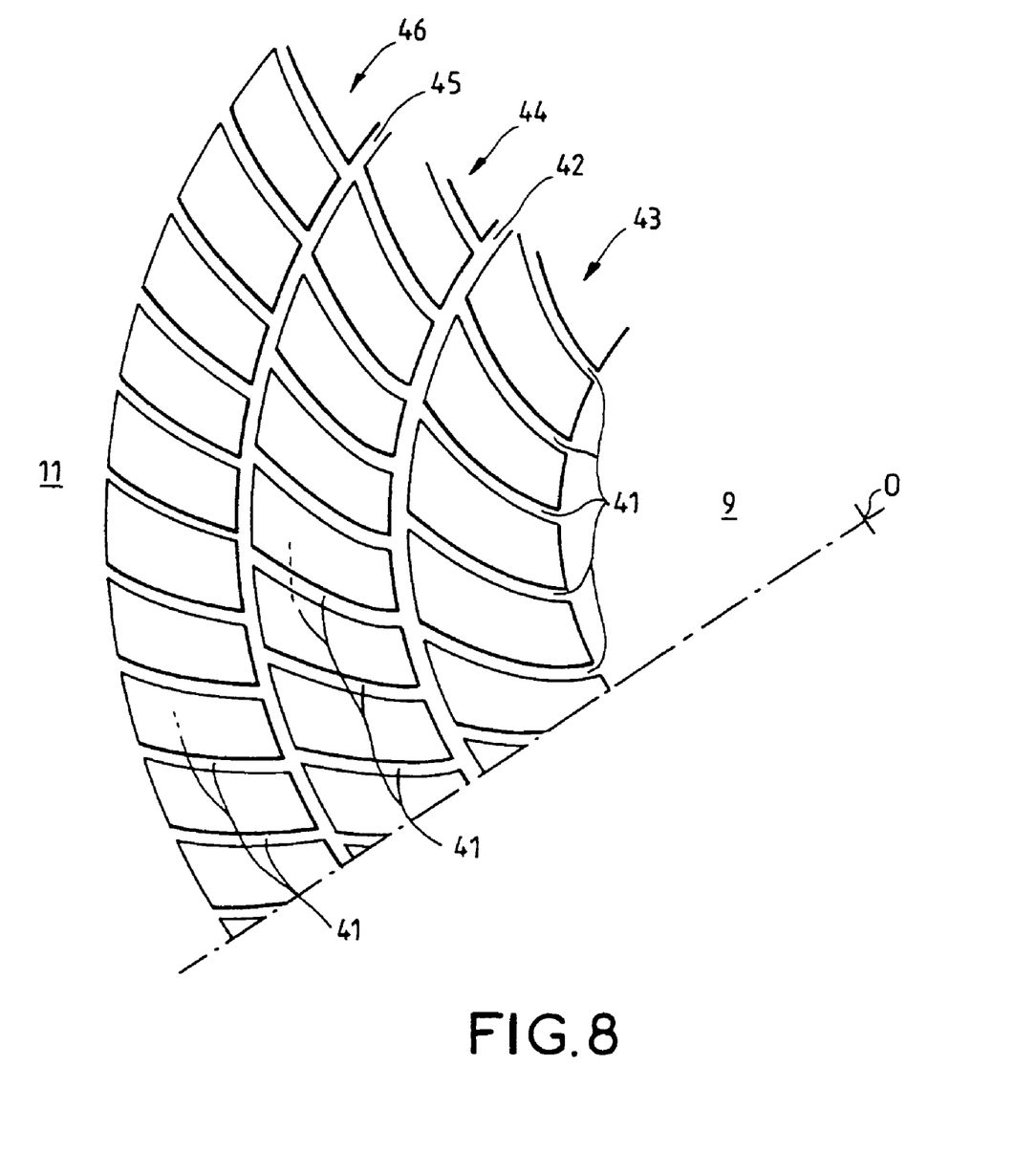
FIG. 8 shows a first alternative of grid mesh comprising several rings of bars that are circle involutes or pseudo-involutes.

FIG. 8 gives a partial view of a grid 40 according to the invention. Only an angular sector about the central point O of the central hub 9 is shown. The entire grid 40 can be reconstituted by duplicating this sector about the point O. The grid 40 has a first ring 43 of first bars 41 extending as circle involutes or pseudo-involutes from the central hub 9.

Advantageously, the grid 40 has at least one second bar 42 fixed to the first ring of first bars 41. The second bar 42 is substantially concentric with the central hub 9. A second ring 44 of first bars 41 extends from the second bar 42.

It is in its initial part, namely the part closest to the circle about which the first bar 41 develops, that the greatest advantage is derived from a bar in the form of a circle involute or pseudo-involute. This is the place where the angle α is still relatively small (see FIG. 5). For this purpose, it may be useful to make several networks of circle involutes or pseudo-involutes in successive and concentric rings. The greater distance from the central hub, the greater is the number of first bars 41 contained in the ring considered. This improves the mechanical rigidity of the grid as well as its capacity to conduct heat.

This structure with two concentric rings 43 and 44 may be duplicated as much as needed. In FIG. 8, a second bar 45, which is still concentric with the central hub 9, is fixed to the periphery of the first bars 41 of the second ring 44. A third ring 46 of first bars 41 extends from the second bar 45 up to the outer collar 11.

Figure 9:
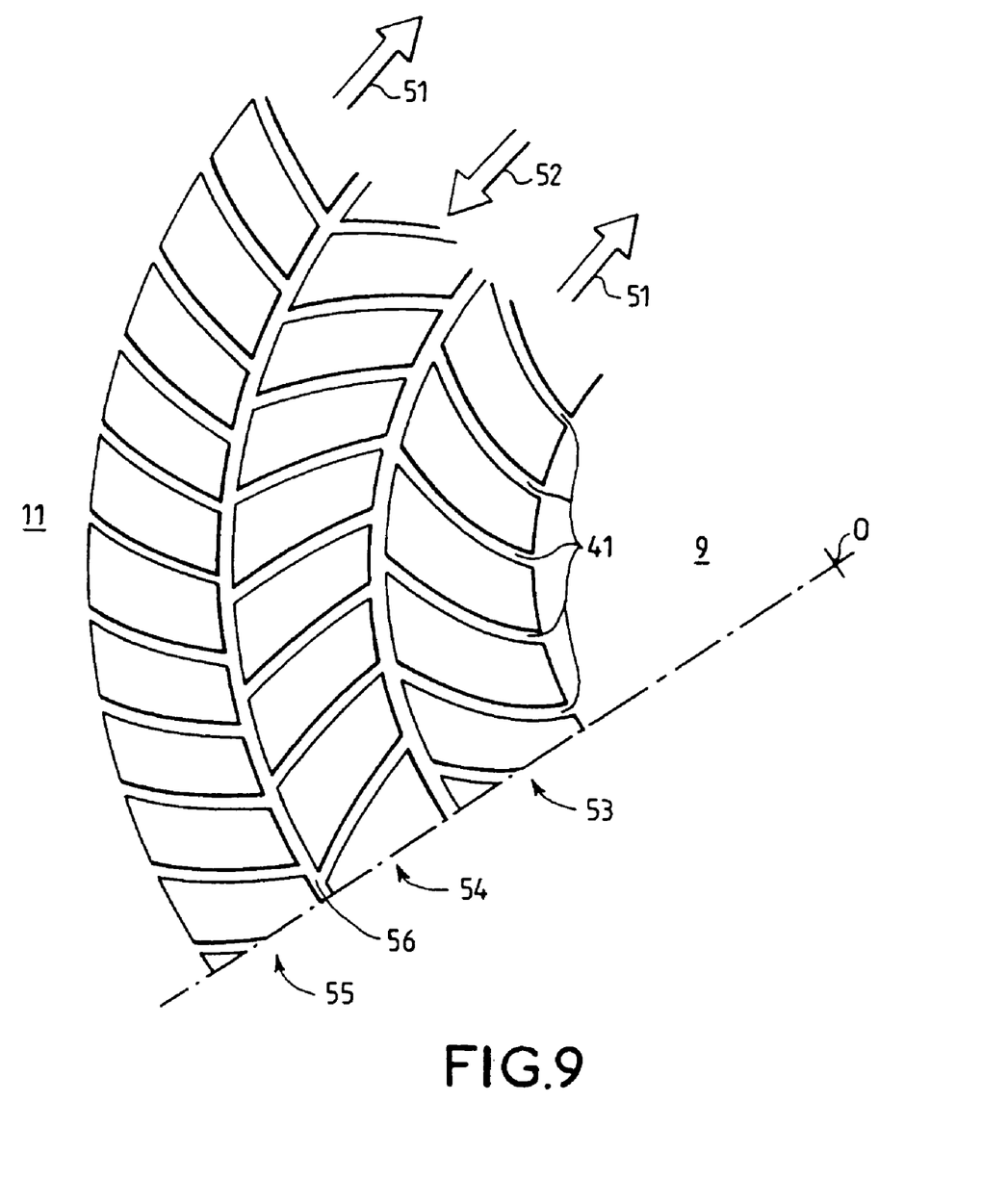
FIG. 9 shows a second alternative grid mesh comprising several rings of bars that are circle involutes or pseudo-involutes.

FIG. 9 represents an alternative embodiment of a grid comprising several rings of first bars 41. As in the case of the variant shown in FIG. 8, only one angular sector about a central point O of the central hub 9 is shown. A first ring 53 of first bars 41 gets oriented in a first sense of rotation about the central hub 9. The first sense of rotation is represented by an arrow 51. A second ring 54 of first bars 41 is oriented in a second sense of rotation about the central hub 9. The second sense of rotation is represented by an arrow 52. The second sense of rotation 52 runs counter to the first sense of rotation 51. As in the case of the variant shown in FIG. 8, this structure with two concentric rings 53 and 54 can be duplicated as needed. Here, a third ring 55 of first bars 41 stretches from a second bar 56 after the outer collar 11. The third ring 55 is oriented in the first sense of rotation 51 about the central hub 9. The senses of rotation of each successive ring thus alternate.

This arrangement improves the geometrical stability of the entire grid. Indeed, most of the materials used to make a grid expand under the effect of any increase in their temperature. In the arrangement shown in FIG. 8, the heat expansion will tend to make each ring 43, 44 and 46 rotate from the periphery of the grid that is formed by the outer collar 11 and is considered to be fixed, up to the central hub 9 which is always in the same direction about an axis perpendicular to the central hub 9. By contrast, in adopting an alternating arrangement as shown in FIG. 9, each ring 53, 54 and 55 will tend to rotate in a direction that is the reverse of that of its neighbor. A certain degree of compensation in the rotation of the grid then occurs, resulting in improved geometrical stability of the grid.

A grid according to the invention can be made from a metal sheet having the desired shape, which may or may not be plane. The metal sheet may be made, for example, out of a molybdenum-based material. It is also possible to use a graphite foil. This metal sheet of this foil is then cut out, for example by sandblasting, laser, waterjet cutting or electro-erosion.

What is claimed is:

1. A control grid of an electron tube, comprising:
   a first ring of first bars fixed to a central hub, the first bars evenly spaced out on a skewed surface, and substantially extended as circle pseudo-involutes about the central hub, so as to form the first ring,
   wherein any pair of two points on adjacent first bars, the pair of two points defined by crossing points of a line perpendicular to the first bars, are equidistant.

2. The grid according to claim 1, further comprising:
   a second bar substantially concentric with the central hub, fixed to the periphery of the first ring; and
   a second ring of first bars, extending from the second bar.

3. The grid according to claim 1, wherein the first bars are evenly spaced out about the central hub.

4. The grid according to claim 2, wherein the first ring of first bars is oriented in a first sense of rotation about the central hub, and the second ring of first bars is oriented in a second sense of rotation about the central hub, the second sense of rotation running counter to the first sense of rotation.

5. The grid according to claim 1, wherein the skewed surface is a surface of a sphere.

6. The grid according to any one of the claims 1 or 3, wherein a first end of each first bar being closest to the central hub, is substantially perpendicular to an element to which the first bar is connected, the element being the central hub or a second bar.

7. A control grid of an electron tube, comprising:
   a first ring of bars, the bars evenly spaced out on a skewed surface and substantially extended as circle pseudo-involutes about a central hub, so as to form the first ring; and
   a second ring of bars, the second ring arranged concentrically around the first ring, the bars evenly spaced out on a skewed surface and substantially extended as circle pseudo-involutes about a central hub, so as to form the second ring.

8. The control grid of an electron tube according to claim 7, wherein the second ring has more bars than the first ring.

* * * * *